US012639497B2

(12) United States Patent
Yin et al.

(10) Patent No.: US 12,639,497 B2
(45) Date of Patent: May 26, 2026

(54) INVERSE DESIGN METHOD OF ON-CHIP FILTER BASED ON EQUIVALENT CIRCUIT SPACE MAPPING

(71) Applicants: ZHEJIANG UNIVERSITY, Hangzhou (CN); ZHEJIANG ZHAOLONG INTERCONNECT TECHNOLOGY CO., LTD., Huzhou (CN)

(72) Inventors: Wenyan Yin, Hangzhou (CN); Jingwei Zhang, Hangzhou (CN); Zhun Wei, Hangzhou (CN); Donghua Ni, Hangzhou (CN); Fang He, Hangzhou (CN); Guoqiang Ye, Hangzhou (CN)

(73) Assignees: ZHEJIANG UNIVERSITY, Hangzhou (CN); ZHEJIANG ZHAOLONG INTERCONNECT TECHNOLOGY CO., LTD., Hangzhou (CN)

( * ) Notice: Subject to any disclaimer, the term of this patent is extended or adjusted under 35 U.S.C. 154(b) by 664 days.

(21) Appl. No.: 18/136,897

(22) Filed: Apr. 20, 2023

(65) Prior Publication Data

US 2023/0267252 A1    Aug. 24, 2023

Related U.S. Application Data

(63) Continuation-in-part of application No. PCT/CN2022/137858, filed on Dec. 9, 2022.

(30) Foreign Application Priority Data

Feb. 21, 2022    (CN) .......................... 202210156353.5

(51) Int. Cl.
*G06N 3/08* (2023.01)
*G06F 30/3308* (2020.01)

(52) U.S. Cl.
CPC ........... *G06F 30/3308* (2020.01); *G06N 3/08* (2013.01)

(58) Field of Classification Search
USPC ................................. 716/101, 103, 104, 107
See application file for complete search history.

(56) References Cited

U.S. PATENT DOCUMENTS

2011/0301922 A1* 12/2011 Tseng .................... G06F 30/367
703/2

FOREIGN PATENT DOCUMENTS

CN            112270151 A  *  1/2021  ............. G06N 3/045

* cited by examiner

*Primary Examiner* — Brian Ngo
(74) *Attorney, Agent, or Firm* — Bayramoglu Law Offices LLC

(57)            ABSTRACT

The present invention discloses an inverse design method of an on-chip filter based on equivalent circuit space mapping, and belongs to the technical field of radio frequency integrated circuits. According to the present invention, based on an equivalent circuit model, a nonlinear relationship between performance parameters and structure parameters of a CMOS millimeter-wave filter is divided into two parts, namely, a part of realizing mapping from performance parameters to equivalent circuit element values by virtue of an odd and even mode theory; and a part of establishing an artificial neural network (ANN) model, in which input vectors are the equivalent circuit element values and output vectors are the structure parameters. By space mapping in the design of the present invention, the defect of discretized sampling of the scattering parameters in a traditional modeling design method is avoided; and compared with forward optimization, the required design time can be significantly shortened.

7 Claims, 9 Drawing Sheets

INVERSE DESIGN METHOD OF ON-CHIP FILTER BASED ON EQUIVALENT CIRCUIT SPACE MAPPING

CROSS REFERENCE TO THE RELATED APPLICATIONS

This application is the continuation-in-part application of International Application No. PCT/CN2022/137858, filed on Dec. 9, 2022, which is based upon and claims priority to Chinese Patent Application No. 202210156353.5, filed on Feb. 21, 2022, the entire contents of which are incorporated herein by reference.

TECHNICAL FIELD

The present invention relates to the technical field of radio frequency integrated circuits, and in particular to an inverse design method of a CMOS millimeter-wave on-chip filter based on equivalent circuit space mapping.

BACKGROUND

Artificial Neural Networks (ANN) simulate a processing mode of neurons of a human brain, and is a network structure including a large number of units and capable of describing a nonlinear relationship of a complex system. An ANN model can learn the nonlinear relationship of the system through training. In the field of radio frequency and microwave circuits, there is a strong nonlinear relationship between a device response and a size structure of a device. Using ANN to describe this nonlinear relationship has been applied in the design of millimeter-wave integrated circuits. In a traditional design flow of millimeter-wave passive devices, a topology structure with the best performance is usually obtained by forward optimization of structure parameters. When the most original ANN is used in the device design, it is also carried out by outputting performance parameters and inputting structure parameters. In order to realize the automatic design of the device according to design indexes, the performance parameters are taken as inputs to the ANN model and structure parameters are taken as outputs. This process is called inverse design. Inverse design can significantly shorten the design time of integrated circuit devices, but it usually requires that the performance parameters are discretized as the inputs to the ANN model, which will lead to inaccurate design results; because a parasitic effect of a system-on-chip is complex in a millimeter-wave frequency band, the discretized performance parameters will inevitably not fully describe the complex parasitic effect.

The document "Inverse Artificial Neural Network for Multiobjective Antenna Design" discloses an inverse design method of an antenna. In this method, targets of the antenna are taken as inputs to the ANN, and the targets include scattering parameters, a gain and a directional diagram of the antenna. This multiobjective input vector ensures the accuracy and reliability of a final inverse design result, but all the target parameters have to be discretized, resulting in that the scale of the neural network is huge, the training time is significantly increased, and at the same time the antenna performance of unsampled frequency points will be missed. Therefore, this method is suitable for the design of narrow-band small antennas, and consumes more time and cost for on-chip antennas in the millimeter-wave frequency band. In addition to using performance parameters as the inputs to the ANN to realize inverse modeling, a method of space mapping has been put forward. The document "An Efficient Artificial Neural Network Model for Inverse Design of Metasurfaces" discloses an ANN inverse modeling method based on transfer function. By mapping performance parameters of a microwave device to the transfer function and training the ANN to learn a nonlinear relationship between a transfer function and structure parameters, this method solves the non-uniqueness problem in inverse design, but this transfer function based on pole residual needs to be extracted by other methods, so that a process of obtaining a data set is very complicated, and this method is not applicable to all passive devices.

The document "Dual-Band FSS Inverse Design Using ANN with Cognition-Driven Sampling" discloses an ANN inverse modeling method based on cognitive driving. The cognitive driving ability is acquired through the accumulation of prior knowledge, and the scattering parameters are sampled through cognitive driving, so that the scale of the ANN is effectively reduced. However, this method does not have high accuracy in millimeter-wave system-on-chip, because the parasitic effect is very easy to exist at the non-sampled frequency points, and the discretized sampling method based on the cognitive driving fails to cover the full-band characteristics of a CMOS on-chip filter.

SUMMARY

The present invention aims at providing an inverse design method of an ANN-based CMOS millimeter-wave on-chip passive structure to overcome the defects of the prior art above. By using an ANN inverse design technology, the on-chip millimeter-wave band-pass filter can be quickly designed; meanwhile, by using the equivalent circuit space mapping method, direct training of the discretized scattering parameters is avoided, the nonlinearity of mapping from the performance parameters to the structure parameters is reduced, the design accuracy is improved, and the training scale of ANN is reduced.

The technical problem proposed by the present invention is solved as follows.

An inverse design method of a CMOS millimeter-wave on-chip filter based on equivalent circuit space mapping includes the following steps.

Step 1, obtaining a training, verification and test sample data set by using circuit simulation and full-wave electromagnetic simulation;

Step 2, by taking equivalent circuit element values as input vectors and a geometric dimension of the CMOS millimeter-wave on-chip filter as an output vector, training an artificial neural network by using the training sample data set, performing verification by using the verification sample data set, and stopping training until a set verification error is met;

Step 3, establishing odd-mode and even-mode equivalent circuit models according to the symmetry of an on-chip filter structure, and performing forward derivation analysis on the on-chip filter structure according to an odd and even mode theory, scattering parameters satisfying the following equations:

$$S_{11} = \frac{Y_0^2 - Y_{even} Y_{odd}}{(Y_0 + Y_{odd})(Y_0 + Y_{even})} \qquad (10)$$

$$S_{21} = \frac{Y_0(Y_{odd} - Y_{even})}{(Y_0 + Y_{odd})(Y_0 + Y_{even})} \qquad (11)$$

where, $S_{11}$ is a return loss, $S_{21}$ is an insertion loss, $Y_0$ is an intrinsic admittance, $Y_{even}$ is an even-mode admittance and $Y_{odd}$ is an odd-mode admittance.

Step 4, expressing odd-mode and even-mode admittances with an intrinsic admittance and scattering parameters, and expressing the odd-mode and even-mode admittances with the equivalent circuit elements according to an analysis of odd-mode and even-mode equivalent circuits, thus establishing a mapping relationship between the scattering parameters and the equivalent circuit element values;

Step 5, determining target ranges of the performance parameters of the on-chip filter, including a center working frequency, the insertion loss, the return loss, a transmission zero, an out-of-band rejection and a 3 dB bandwidth;

Step 6, extracting the scattering parameter of a certain frequency in a frequency band by a cognitive driving method, and substituting this scattering parameter value into the mapping relationship between the scattering parameters and the equivalent circuit element values to realize the extraction of initial equivalent circuit element values;

Step 7, adjusting the initial equivalent circuit element values through circuit tuning to meet design indexes;

Step 8, taking the tuned equivalent circuit element values as an input part of the trained neural network, and testing the neural network.

Further, in a process of acquiring sample data sets in step 2, firstly, sufficient output parts of the sample data sets are obtained through full-wave electromagnetic simulation and parametric scanning, and equivalent circuit element values corresponding to each group of outputs are obtained through circuit simulation and taken as input parts of the sample data sets.

Furthermore, the odd-mode and even-mode equivalent circuit models in step 3 include description of electromagnetic characteristics of a transmission line part, description of filtering characteristics, and description of a coupling effect between a metal signal line and a substrate.

Further, step 4 specifically includes:

expressing an analytical form of odd-mode and even-mode admittances with the intrinsic admittance and scattering parameters:

$$Y_{even} = Y_0 \frac{1 - S_{11} - S_{21}}{1 + S_{11} + S_{21}} \qquad (12)$$

$$Y_{odd} = Y_0 \frac{1 - S_{11} + S_{21}}{1 + S_{11} - S_{21}} \qquad (13)$$

establishing corresponding analytical expressions of the odd-mode and even-mode admittances and equivalent circuit elements:

$$Y_{even} = \frac{1}{j\omega L_2 + 2j\omega L_3 + \dfrac{j\omega L_1}{1 - \omega^2 L_1 C_1}} + j\omega C_2 + \frac{1}{R_1} \qquad (14)$$

$$Y_{odd} = \frac{1}{j\omega L_2 + \dfrac{j\omega L_1}{1 - \omega^2 L_1 C_1}} + j\omega C_2 + \frac{1}{R_1} \qquad (15)$$

$$\omega_{TZ} = \frac{1}{\sqrt{L_1 C_1}} \qquad (16)$$

where, $\omega_{TZ}$ represents an angular frequency of the transmission zero, $\omega=2\pi f$ represents a working center angular frequency, and f represents a center working frequency; $R_1$ represents a resistance of the transmission line, $L_2$ represents an inductance of the transmission line, $L_1$ and $C_1$ represent transmission zero inductance and capacitance introduced by a multilayer metal layer in a CMOS process, $C_2$ represents a coupling capacitance between a metal layer and a lossy silicon substrate, $L_3$ represents an inductance of a metal transmission line, j is an imaginary unit; $R_1$, $L_2$ and $C_2$ are directly determined by the circuit simulation;

establishing a mapping relationship between the scattering parameters and the equivalent circuit elements by equations (12)-(16):

$$L_1 = \frac{(\omega^2 - \omega_{TZ}^2) \times \left( \omega^2 L_2 C_2 - \dfrac{j\omega L_2}{R_1} + j\omega L_2 Y_{odd} - 1 \right)}{\omega \times \omega_{TZ}^2 \left( \omega C_2 + j Y_{odd} - \dfrac{j}{R_1} \right)} \qquad (17)$$

$$C_1 = \frac{\omega \left( \omega C_2 + j Y_{odd} - \dfrac{j}{R_1} \right)}{(\omega^2 - \omega_{TZ}^2) \times \left( \omega^2 L_2 C_2 - \dfrac{j\omega L_2}{R_1} + j\omega L_2 Y_{odd} - 1 \right)} \qquad (18)$$

$$L_3 = j \times \frac{j\omega L_2 + \dfrac{R_1}{1 - R_1 Y_{even} + j\omega R_1 C_2} - X}{2\omega} \qquad (19)$$

$$X = \frac{\left( (\omega^2 - \omega_{TZ}^2) \times \left( j\omega^2 C_2 L_2 + \omega L_2 \dfrac{1}{R_1} - \omega L_2 Y_{odd} - j \right) \right)}{\omega_{TZ}^2 \left( \dfrac{\omega^2}{\omega_{TZ}^2} - 1 \right) \left( \omega C_2 + j Y_{odd} - \dfrac{j}{R_1} \right)} \qquad (20)$$

Since a transmission line part of the on-chip filter model is fixed, the equivalent circuit elements $R_1$, $L_2$ and $C_2$ can be determined by circuit simulation, and so far the mapping relationship between the performance parameters and element values has been established.

Further, the initial equivalent circuit element values extracted by the cognitive driving method in step 6 are the scattering parameters at the center frequency of the design index, because the scattering parameter at the center frequency can best reflect the electromagnetic transmission characteristic of the on-chip filter.

The present invention has the beneficial effects as follows.

According to the present invention, the traditional odd and even mode theory is skillfully transformed to obtain an extraction method of the initial equivalent circuit element values, and on this basis, circuit tuning is performed to obtain the circuit element values meeting index requirements. By using the circuit element values as inputs to the ANN, the omission of the on-chip parasitic effect is potentially avoided, and the training cost of the ANN is reduced, as compared to using discretized values of the performance parameters as inputs to the ANN.

According to the design requirements, the present invention can complete the inverse design of the CMOS millimeter-wave on-chip filter, and by space mapping in the design, the defect of discretized sampling of the scattering parameters in a traditional modeling design method is avoided; and compared with forward optimization, the required design time can be significantly shortened. The present invention provides a novel method for an intellectualized design of a CMOS millimeter-wave on-chip passive device, and has a great application value in design optimization of millimeter-wave circuits for 5G communications.

DETAILED DESCRIPTION OF THE EMBODIMENTS

The present invention will be further explained with the attached drawings and embodiments.

This embodiment provides an inverse design method of a CMOS millimeter-wave on-chip filter based on equivalent circuit space mapping, which includes the following steps:

Step 1, obtaining a training and verification sample data set by using circuit simulation and full-wave electromagnetic simulation;

training, verifying and testing an ANN by using 120 groups of training samples, 20 groups of verification samples and 10 groups of test samples, wherein a verification error is set to 5%, the number of input nodes of the ANN is 3, the number of nodes of a hidden layer is 7 and the number of output nodes is 4. The activation functions selected by the hidden layer and the output layer are hyperbolic tangent S-shaped functions, and the function expression is as follows:

$$\tanh(x) = \frac{2}{1 + e^{-2x}} - 1 \tag{21}$$

Figure 1:
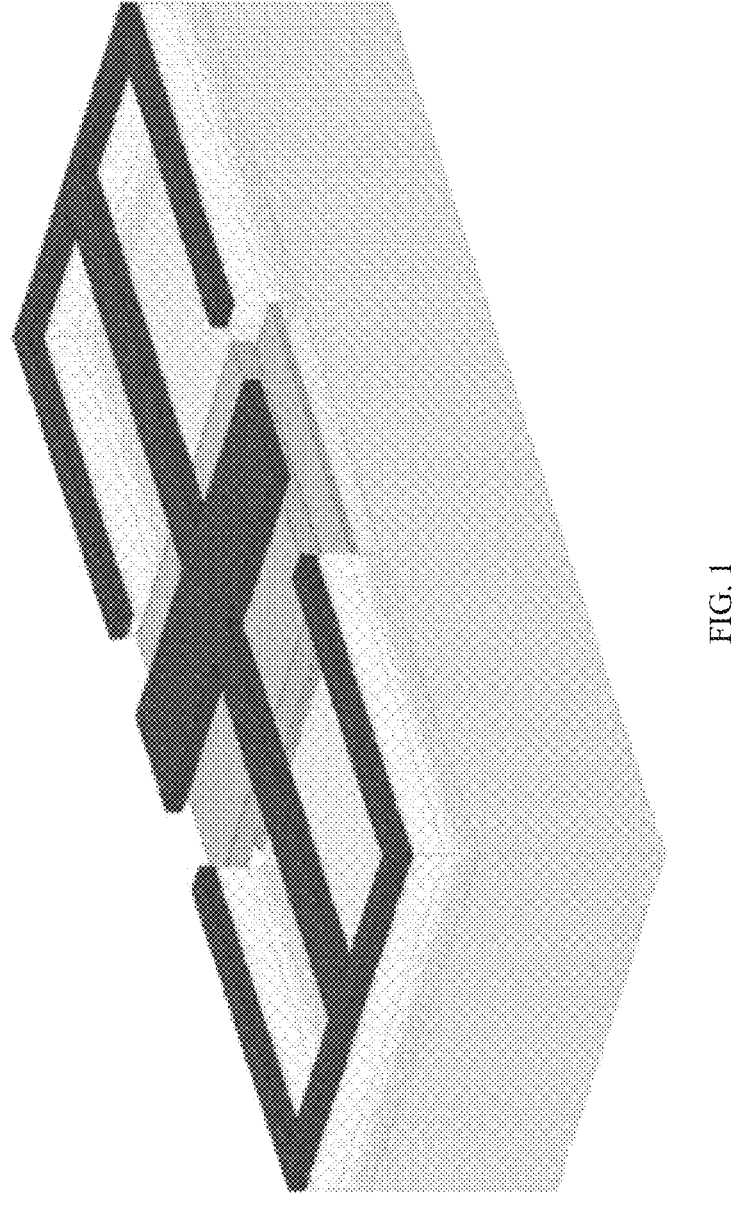
FIG. 1 is a three-dimensional structural diagram of a CMOS millimeter-wave on-chip filter according to an embodiment of the present invention.
Figure 2:
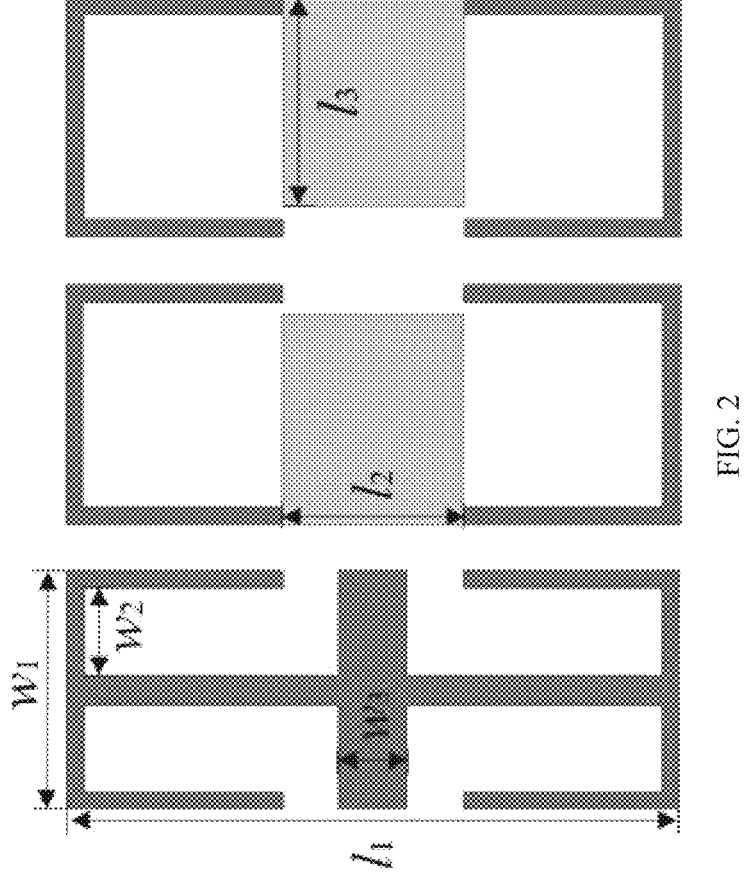
FIG. 2 is a top view of a metal layer used in the CMOS millimeter-wave on-chip filter according to the embodiment of the present invention.
Figure 3:
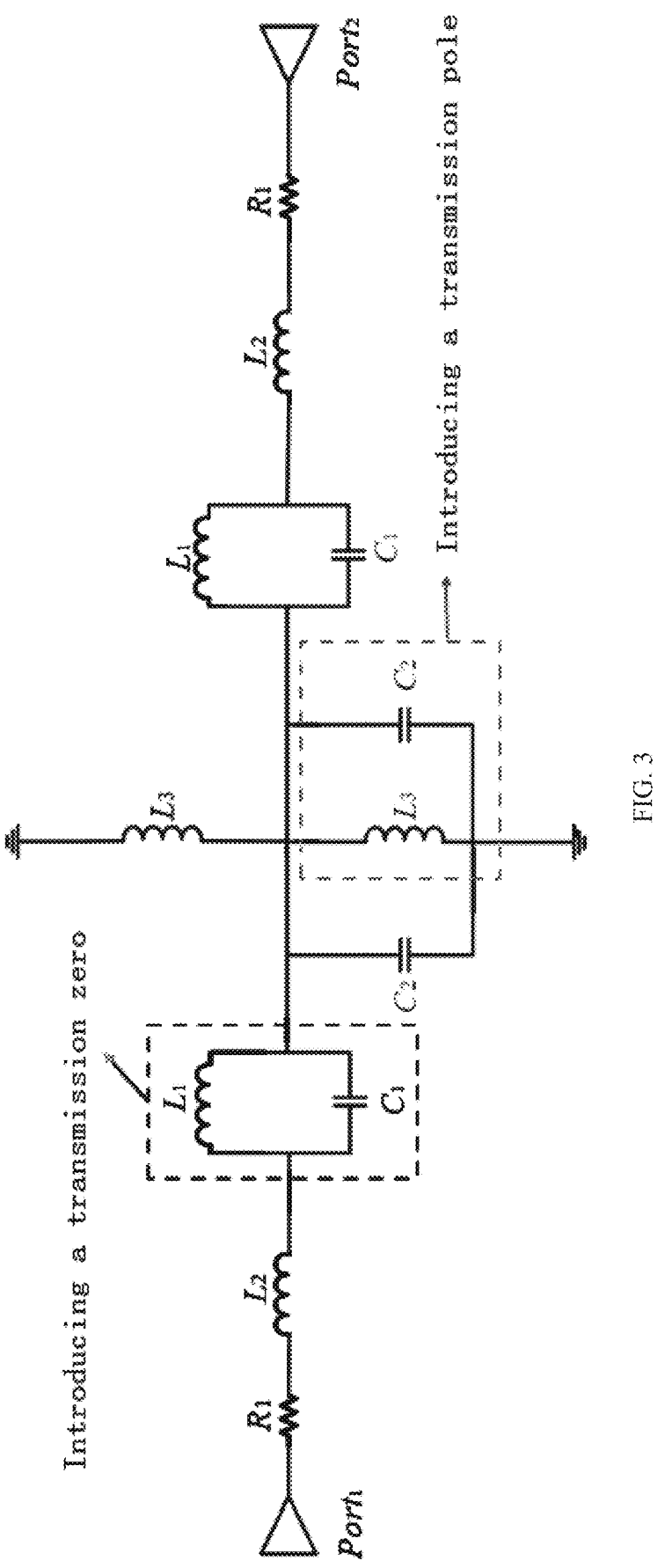
FIG. 3 is an equivalent circuit diagram of the CMOS millimeter-wave on-chip filter according to the embodiment of the present invention.

Step 2, by taking equivalent circuit element values as input vectors and structure parameters corresponding to the equivalent circuit element values as output vectors, training the ANN and stopping training until the verification error is less than a set value;

Step 3, executing a test process;

Step 4, by using a CMOS millimeter-wave on-chip filter structure shown in FIG. 1 and FIG. 2, firstly, determining design indexes of a CMOS millimeter-wave on-chip filter, including a center working frequency, an insertion loss, a return loss, a transmission zero, an out-of-band rejection and a 3 dB bandwidth. The specific indexes are set as follows:

Insertion loss: <2.5 dB;

Return loss: >20 dB;

Center frequency is 60±2 GHz;

Transmission zero position is 40±2 GHz;

Out-of-band rejection (30-45 GHz): <−20 dB;

−3 dB relative bandwidth: >5%

Figure 4:
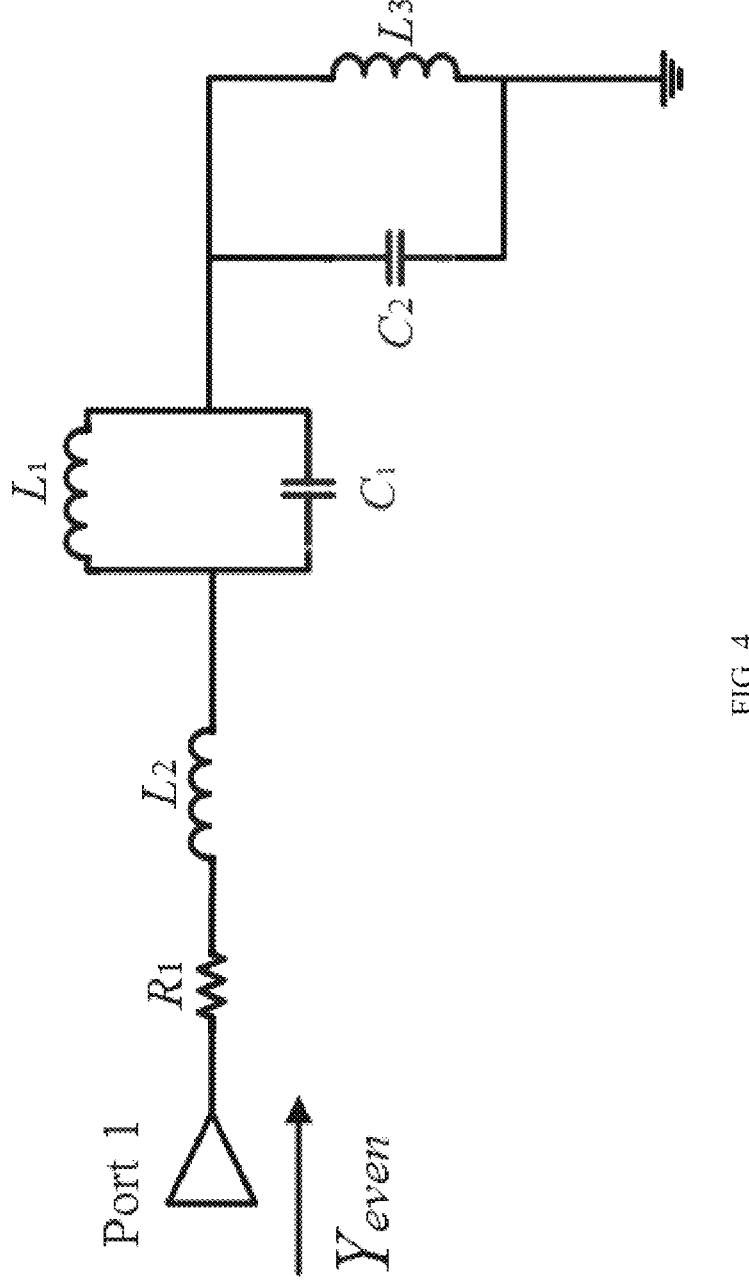
FIG. 4 is an even-mode equivalent circuit diagram of the CMOS millimeter-wave on-chip filter according to the embodiment of the present invention.
Figure 5:
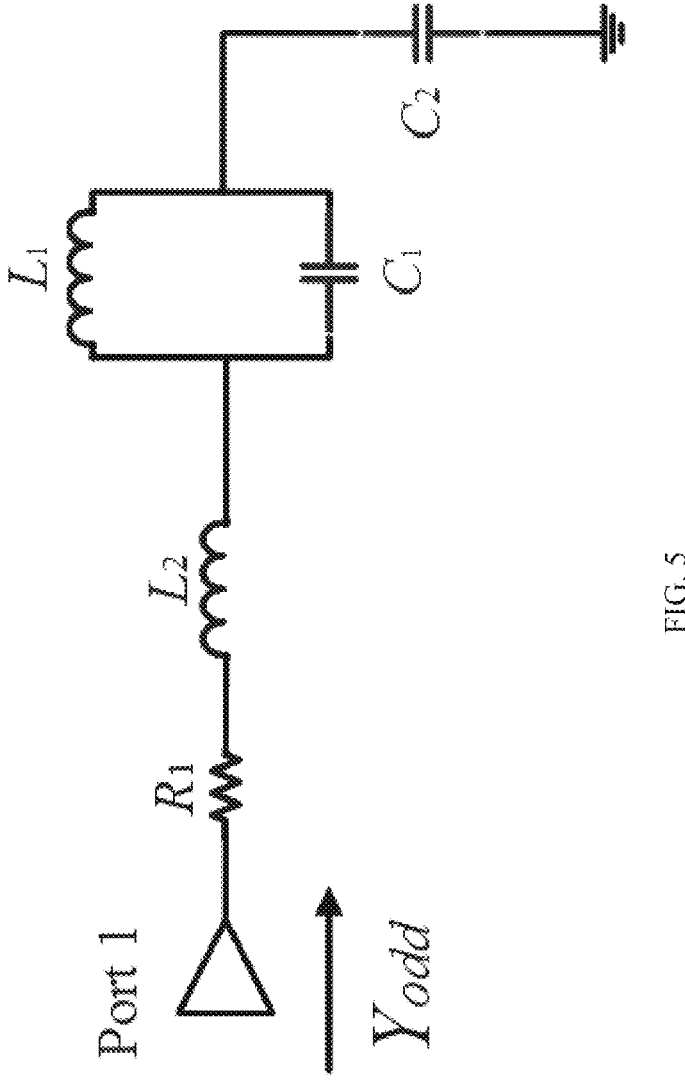
FIG. 5 is an odd-mode equivalent circuit diagram of the CMOS millimeter-wave on-chip filter according to the embodiment of the present invention.
Figure 6:
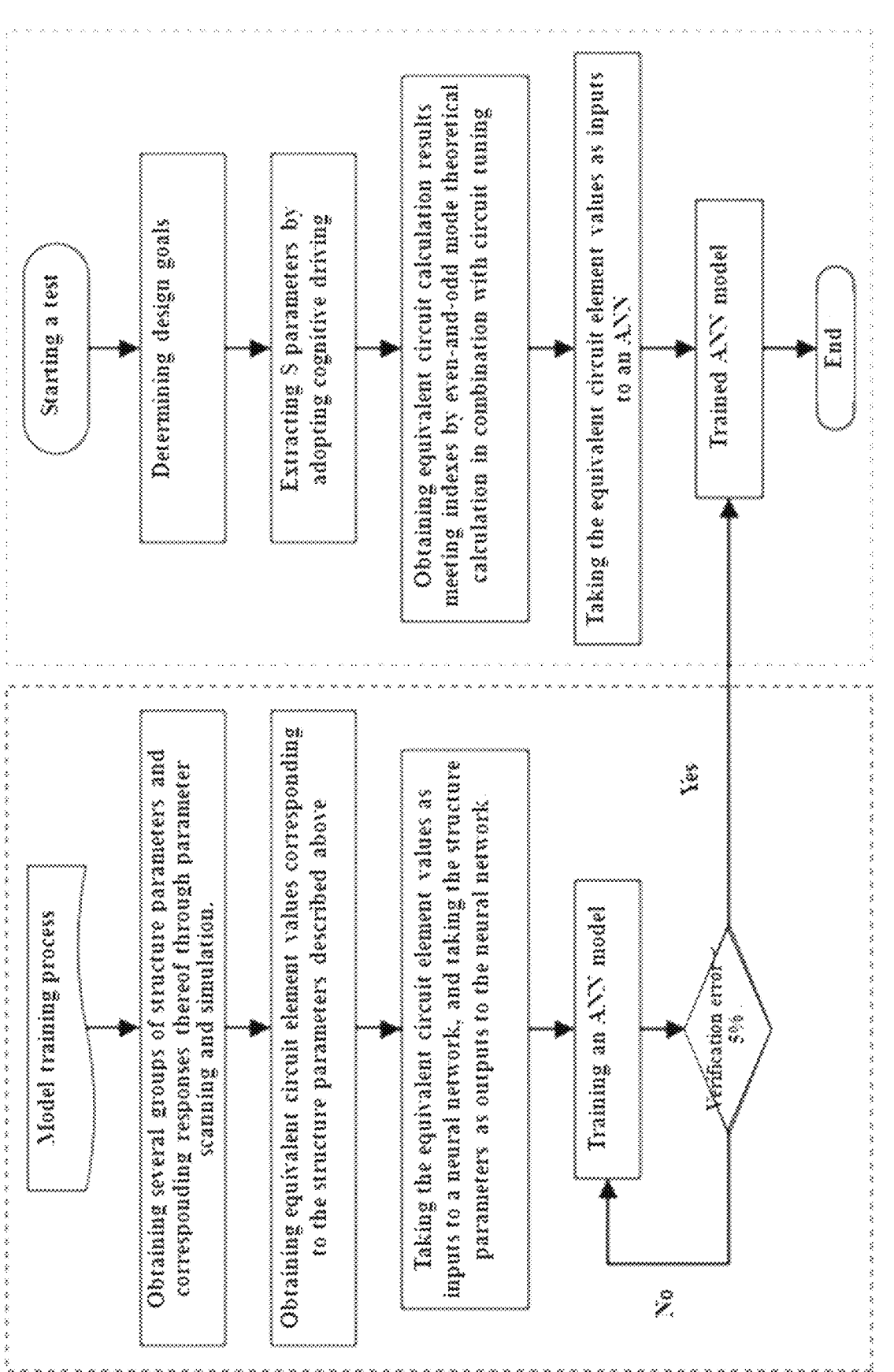
FIG. 6 is a flowchart of a method according to the present invention.
Figure 7:
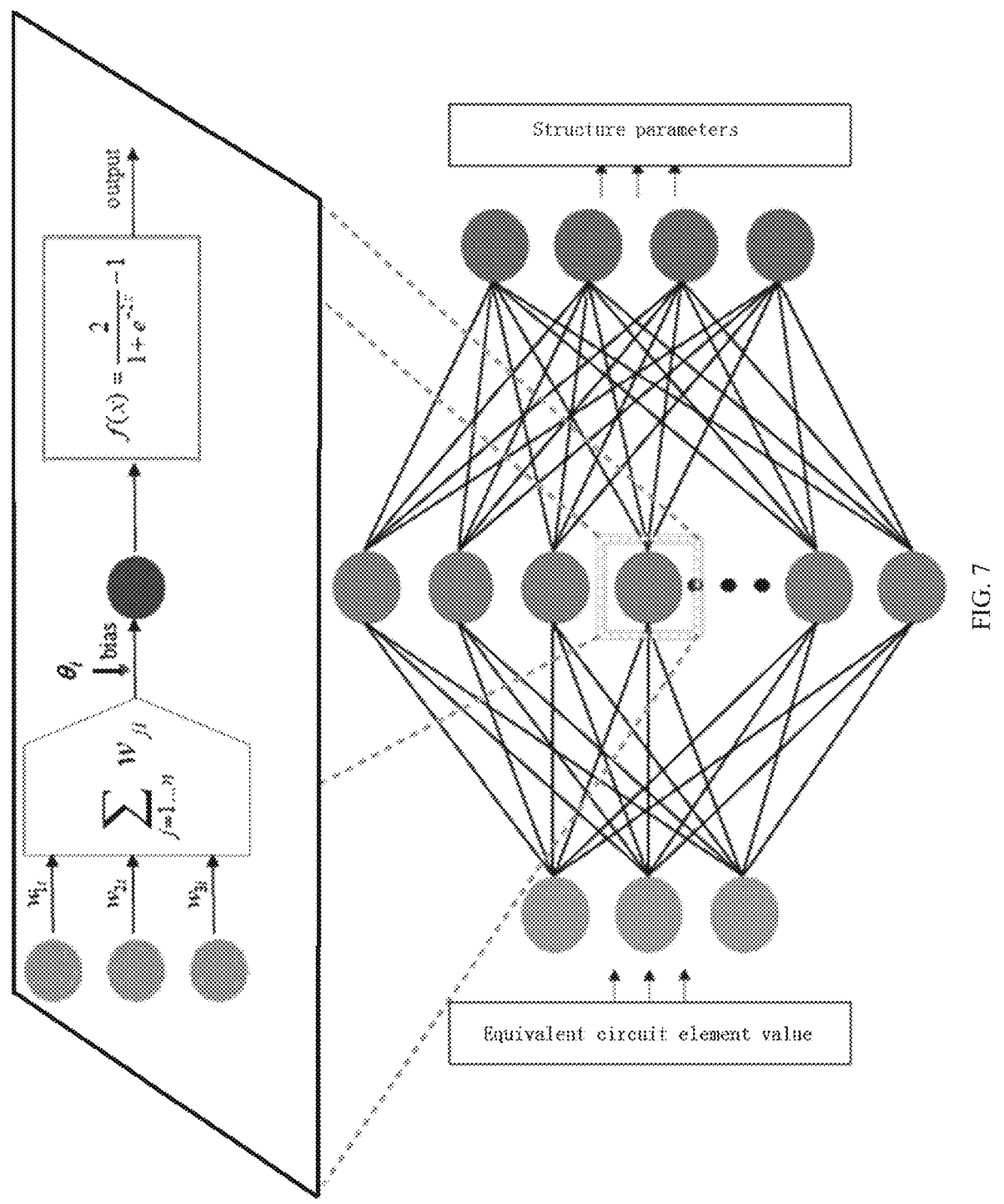
FIG. 7 is a diagram of an ANN model according to the present invention.

Step 5, selecting a center frequency point of 60 GHz according to the cognitive driving method, and substituting corresponding scattering parameters $S_{11}$ and $S_{21}$, which are −0.1 and 0.9+j0.1 respectively, into the following quotations for calculation and circuit tuning, element symbols corresponding to those in FIG. 4 and FIG. 5:

$$L_1 = \frac{(\omega^2 - \omega_{TZ}^2) \times \left( \omega^2 L_2 C_2 - \frac{j\omega L_2}{R_1} + j\omega L_2 Y_{odd} - 1 \right)}{\omega \times \omega_{TZ}^2 \left( \omega C_2 + jY_{odd} - \frac{j}{R_1} \right)} \tag{24}$$

$$C_1 = \frac{\omega \left( \omega C_2 + jY_{odd} - \frac{j}{R_1} \right)}{(\omega^2 - \omega_{TZ}^2) \times \left( \omega^2 L_2 C_2 - \frac{j\omega L_2}{R_1} + j\omega L_2 Y_{odd} - 1 \right)} \tag{25}$$

$$L_3 = j \times \frac{j\omega L_2 + \frac{R_1}{1 - R_1 Y_{even} + j\omega R_1 C_2} - X}{2\omega} \tag{26}$$

$$X = \frac{\left( (\omega^2 - \omega_{TZ}^2) \times \left( j\omega^2 C_2 L_2 + \omega L_2 \frac{1}{R_1} - \omega L_2 Y_{odd} - j \right) \right)}{\omega_{TZ}^2 \left( \frac{\omega^2}{\omega_{TZ}^2} - 1 \right) \left( \omega C_2 + jY_{odd} - \frac{j}{R_1} \right)} \tag{27}$$

Figure 8:
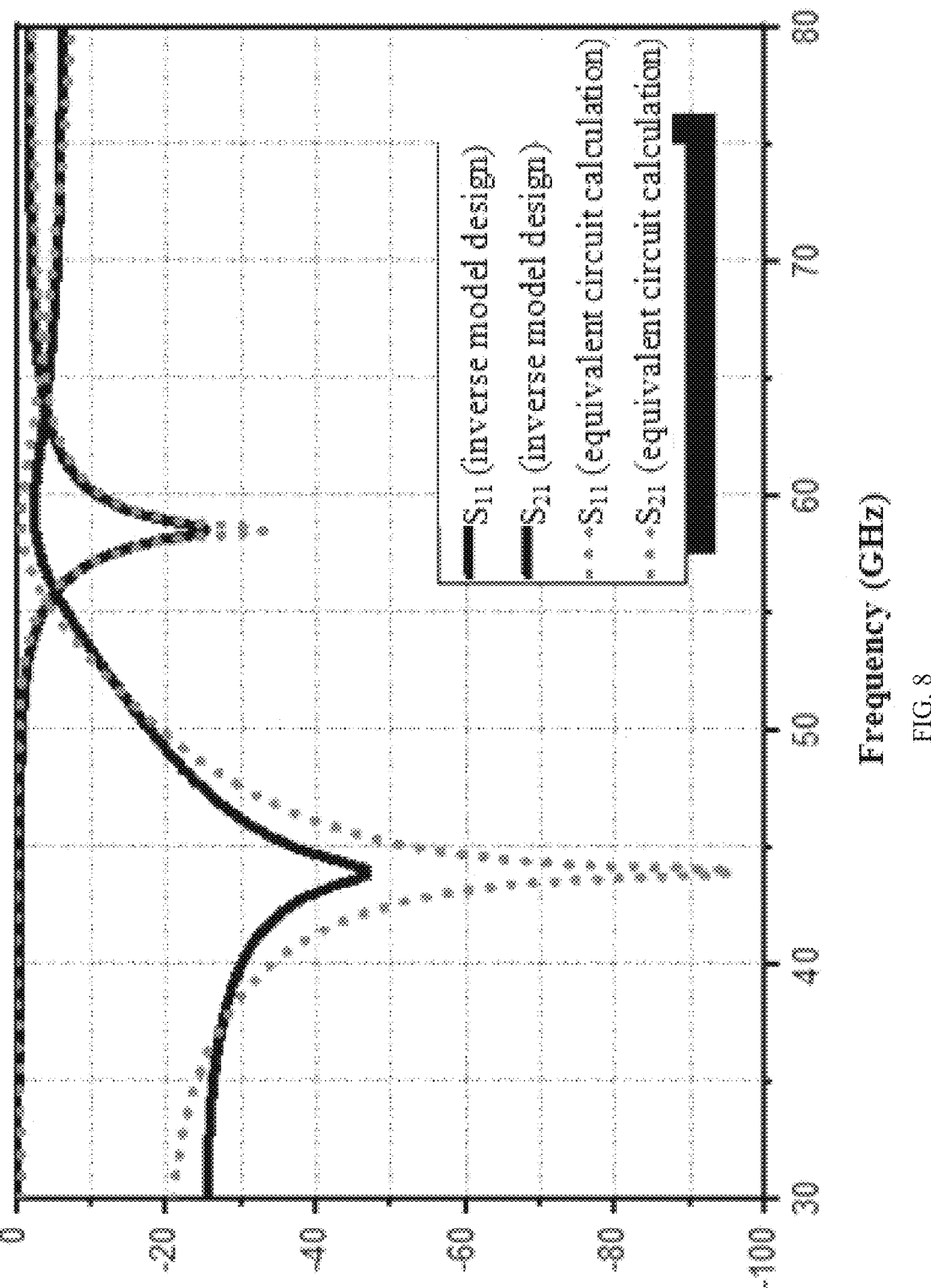
FIG. 8 is a test result diagram of a design method according to an embodiment of the present invention.

Step 6, substituting tuned equivalent circuit elements that meet design requirements into the trained ANN model to get the corresponding structure parameters, and performing simulation verification according to the structure parameters. FIG. 8 shows a comparison diagram between calculation results of equivalent circuit elements and verification results of neural network output parameters by full-wave electromagnetic simulation software.

Figure 9:
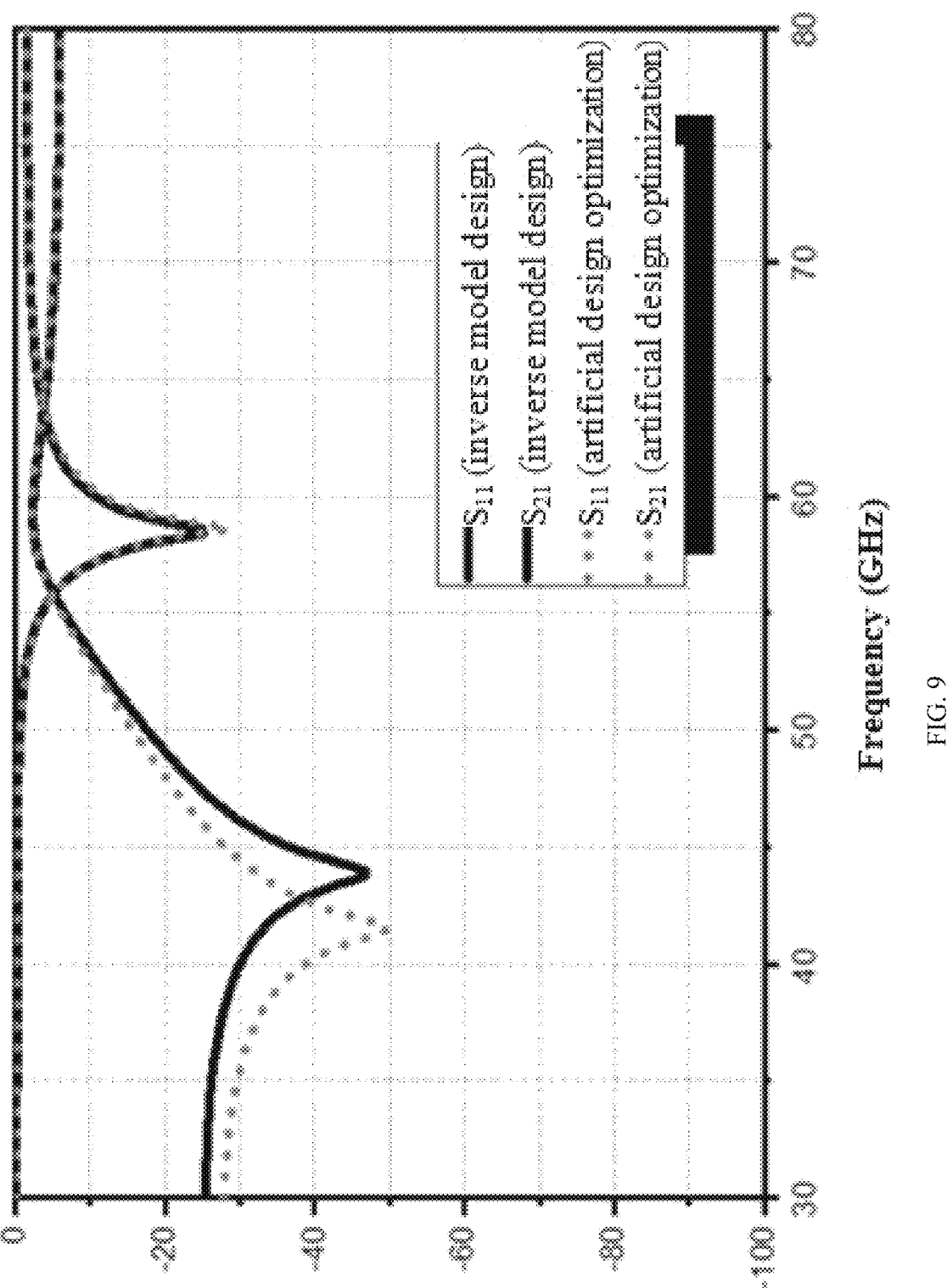
FIG. 9 is a comparison diagram of optimization results and inverse design results under a working frequency of 60 GHz according to the design method of the embodiment of the present invention.

Step 7, comparing a result of artificial design optimization with a result of inverse modeling, and the comparison results are shown in FIG. 9. FIG. 9 shows a comparison diagram between the performance result obtained by artificial forward design optimization and the performance result obtained by ANN inverse design. The performance results are in good agreement, but the ANN inverse design method avoids the time consumption in forward optimization.

To sum up, the present invention can provide a novel method for inverse design of a CMOS millimeter-wave on-chip filter based on equivalent circuit space mapping. By using an ANN inverse design technology, the on-chip millimeter-wave band-pass filter can be quickly designed; meanwhile, by using the equivalent circuit space mapping method, direct training of the discretized scattering parameters is avoided, the nonlinearity of mapping from the performance parameters to the structure parameters is reduced, the design accuracy is improved, and the training scale of ANN is reduced. The present invention provides a novel method for an intellectualized design of a CMOS millimeter-wave on-chip passive device, and has an application value in the design optimization of millimeter-wave circuits for 5G communications.

7                                                                    8

What is claimed is:

1. An inverse design method of an on-chip filter based on equivalent circuit space mapping, wherein the inverse design method comprises the following steps:

1) acquiring a sample data set, and by taking equivalent circuit element values in the sample data set as input vectors and structure parameters as output vectors, performing training to obtain an artificial neural network model ANN;

2) determining performance parameters of the filter to be designed, and realizing mapping from the performance parameters to the equivalent circuit element values by virtue of an odd and even mode theory, so as to obtain the equivalent circuit element values of the filter to be designed; and 3) taking the equivalent circuit element values of the filter to be designed as an input part of the ANN obtained in step 1), and outputting corresponding structure parameters.

2. The inverse design method of the on-chip filter based on the equivalent circuit space mapping according to claim 1, wherein the step 1) specifically comprises:

1.1) obtaining a sample data set by using circuit simulation and full-wave electromagnetic simulation, the sample data set comprising structure parameters and equivalent circuit element values of a sample filter;

1.2) dividing the sample data set into a training set and a verification set, training the ANN by taking the equivalent circuit element values of the sample filter in the training set as input vectors and the structure parameters as output vectors, and performing verification by using the verification set until a verification error meets a set condition, thereby completing the training.

3. The inverse design method of the on-chip filter based on the equivalent circuit space mapping according to claim 2, wherein in the step 1.1), the structure parameters of the sample filter are obtained through the full-wave electromagnetic simulation and parametric scanning; the equivalent circuit element values corresponding to each group of structure parameters are obtained through the circuit simulation.

4. The inverse design method of the on-chip filter based on the equivalent circuit space mapping according to claim 2, wherein in the step 1.2), when the ANN is trained, an expression of an activation function selected by a hidden layer and an output layer is as follows:

$$\tanh(x) = \frac{2}{1 + e^{-2x}} - 1.$$

5. The inverse design method of the on-chip filter based on the equivalent circuit space mapping according to claim 1, wherein the step 2) specifically comprises:

2.1) according to the symmetry of a CMOS millimeter-wave on-chip filter structure, establishing odd-mode and even-mode equivalent circuit models, expressing odd-mode and even-mode admittances with an intrinsic admittance and scattering parameters; expressing the odd-mode and even-mode admittances with the equivalent circuit element values according to an analysis of odd-mode and even-mode equivalent circuits, thus establishing a mapping relationship between the scattering parameters and the equivalent circuit element values;

2.2) determining the performance parameters of the filter to be designed, comprising target ranges of a center working frequency, an in-band insertion loss, an in-band return loss, a transmission zero, an out-of-band rejection and a 3 dB bandwidth;

2.3) extracting scattering parameters of an in-band center frequency of the filter to be designed by adopting a cognitive driving method, and substituting the scattering parameters into the mapping relationship obtained in 2.1) to obtain initial equivalent circuit element values of the filter to be designed; and 2.4) through equivalent circuit tuning of the CMOS millimeter-wave filter, adjusting the initial equivalent circuit element values to meet design indexes, so as to obtain the equivalent circuit element values of the filter to be designed.

6. The inverse design method of the on-chip filter based on the equivalent circuit space mapping according to claim 5, wherein the odd-mode and even-mode equivalent circuit models in step 2.1) include description of electromagnetic characteristics, description of filtering characteristics of a transmission line part and description of a coupling effect between a metal signal line and a substrate.

7. The inverse design method of the on-chip filter based on the equivalent circuit space mapping according to claim 5, wherein the step 2.1) specifically comprises:

expressing the odd-mode and even-mode admittances with the intrinsic admittance and the scattering parameters:

$$Y_{even} = Y_0 \frac{1 - S_{11} - S_{21}}{1 + S_{11} + S_{21}} \tag{1}$$

$$Y_{odd} = Y_0 \frac{1 - S_{11} + S_{21}}{1 + S_{11} - S_{21}} \tag{2}$$

where, $S_{11}$ is the return loss, $S_{21}$ is the insertion loss, $Y_0$ is the intrinsic admittance, $Y_{even}$ is the even-mode admittance and $Y_{odd}$ is the odd-mode admittance;

expressing the odd-mode and even-mode admittances with equivalent circuit elements:

$$Y_{even} = \frac{1}{j\omega L_2 + 2j\omega L_3 + \dfrac{j\omega L_1}{1 - \omega^2 L_1 C_1}} + j\omega C_2 + \frac{1}{R_1} \tag{3}$$

$$Y_{odd} = \frac{1}{j\omega L_2 + \dfrac{j\omega L_1}{1 - \omega^2 L_1 C_1}} + j\omega C_2 + \frac{1}{R_1} \tag{4}$$

$$\omega_{TZ} = \frac{1}{\sqrt{L_1 C_1}} \tag{5}$$

where, $\omega_{TZ}$ represents an angular frequency of the transmission zero, $\omega = 2\pi f$ represents a working center angular frequency, and f represents a center working frequency; $R_1$ represents a resistance of the transmission line, $L_2$ represents an inductance of the transmission line, $L_1$ and $C_1$ represent transmission zero inductance and capacitance introduced by a multilayer metal layer in a CMOS process, $C_2$ represents a coupling capacitance between a metal layer and a lossy silicon substrate, $L_3$ represents an inductance of a metal transmission line, j is an imaginary unit; $R_1$, $L_2$ and $C_2$ are directly determined by the circuit simulation;

through arrangement, the following equations are obtained from equations (1)-(5):

$$L_1 = \frac{\left(\omega^2 - \omega_{TZ}^2\right) \times \left(\omega^2 L_2 C_2 - \dfrac{j\omega L_2}{R_1} + j\omega L_2 Y_{odd} - 1\right)}{\omega \times \omega_{TZ}^2 \left(\omega C_2 + jY_{odd} - \dfrac{j}{R_1}\right)} \qquad (6)$$

$$C_1 = \frac{\omega\left(\omega C_2 + jY_{odd} - \dfrac{j}{R_1}\right)}{\left(\omega^2 - \omega_{TZ}^2\right) \times \left(\omega^2 L_2 C_2 - \dfrac{j\omega L_2}{R_1} + j\omega L_2 Y_{odd} - 1\right)} \qquad (7)$$

$$L_3 = j \times \frac{j\omega L_2 + \dfrac{R_1}{1 - R_1 Y_{even} + j\omega R_1 C_2} - X}{2\omega} \qquad (8)$$

where, $$X = \frac{\left(\left(\omega^2 - \omega_{TZ}^2\right) \times \left(j\omega^2 C_2 L_2 + \omega L_2 \dfrac{1}{R_1} - \omega L_2 Y_{odd} - j\right)\right)}{\omega_{TZ}^2 \left(\dfrac{\omega^2}{\omega_{TZ}^2} - 1\right)\left(\omega C_2 + jY_{odd} - \dfrac{j}{R_1}\right)} \qquad (9)$$

equations (6)-(8) are the mapping relationship between the scattering parameters and the equivalent circuit element values.

\* \* \* \* \*